United States Patent [19]
Choi

[11] Patent Number: 6,103,450
[45] Date of Patent: Aug. 15, 2000

[54] PHOTOSENSITIVE POLYMER, DISSOLUTION INHIBITOR AND CHEMICALLY AMPLIFIED PHOTORESIST COMPOSITION CONTAINING THE SAME

[75] Inventor: Sang-jun Choi, Seoul, Rep. of Korea

[73] Assignee: Samsung Electronics Co., Ltd., Kyungki-do, Rep. of Korea

[21] Appl. No.: 09/276,735

[22] Filed: Mar. 26, 1999

[30]     Foreign Application Priority Data

Jun. 11, 1998 [KR] Rep. of Korea ...................... 98-21761

[51] Int. Cl.$^7$ ....................................................... G03C 1/73
[52] U.S. Cl. .................................... 430/270.1; 430/281.1; 430/286.1; 430/905; 430/917; 525/73; 522/31; 522/57
[58] Field of Search ............................ 430/270.1, 281.1, 430/286.1, 917, 905, 926; 525/73; 522/31, 57

[56]            References Cited

U.S. PATENT DOCUMENTS

| | | | |
|---|---|---|---|
| 4,841,005 | 6/1989 | Tamaru et al. ........................... | 526/245 |
| 4,853,315 | 8/1989 | McKean et al. ......................... | 430/192 |
| 5,225,483 | 7/1993 | Datta et al. ............................... | 525/73 |
| 5,843,624 | 12/1998 | Houlihan et al. ........................ | 430/296 |

FOREIGN PATENT DOCUMENTS 794458   3/1997   European Pat. Off. .

OTHER PUBLICATIONS

Uzodinma Okoroanyanwu et al. "Alicyclic Polymers of 193 nm Resist Applications: Synthesis and Characterization", Chem. Matters 1998, 10, 3319–3327.

*Primary Examiner*—Janet Baxter
*Assistant Examiner*—Yvette M. Clarke
*Attorney, Agent, or Firm*—Kile, McIntyre, Harbin & Lee; Eugene M. Lee

[57]                ABSTRACT

A photosensitive polymer, a dissolution inhibitor, and a chemically amplified photoresist composition containing the photosensitive polymer and the dissolution inhibitor are provided. The photosensitive polymer is a copolymer polymerized with 5-norbornene-2-methanol derivative monomer having a $C_1$ to $C_{20}$ aliphatic hydrocarbon as a side chain, and a maleic anhydride monomer. The dissolution inhibitor is a tricyclodecane derivative or a sarsasapogenin derivative, each having an acid-labile group as a functional group. The chemically amplified photoresist composition containing the photosensitive polymer and/or dissolution inhibitor has a strong resistance to etching and excellent adherence to underlying layer.

20 Claims, No Drawings

PHOTOSENSITIVE POLYMER, DISSOLUTION INHIBITOR AND CHEMICALLY AMPLIFIED PHOTORESIST COMPOSITION CONTAINING THE SAME

BACKGROUND OF THE INVENTION

1. Field of the Invention

The present invention relates generally to photosensitive polymers and photoresists and more particularly, to a photosensitive polymer, a dissolution inhibitor, and a chemically-amplified photoresist composition containing the same.

2. Description of the Related Art

Since current semiconductor chips are highly integrated, it is generally essential to form fine patterns in photolithography. In particular, a device of 1Gbit or more generally requires a submicron pattern, prompting the use of an ArF excimer laser (193 nm) of a shorter wavelength than a conventional KrF excimer laser (248 nm) as a photolithography exposing light source. Thus, demand for a photosensitive polymer and a photoresist composition for a new chemically amplified photoresist suitable for the ArF excimer laser has increased.

In general, the chemically amplified photoresist composition for the ArF excimer laser needs the following requirements. The requirements of the chemically amplified photoresist composition are typically: (1) being transparent against 193 nm wavelength, (2) being thermally excellent (e.g., having a high glass transition temperature), (3) having excellent adhesion to a layer, (4) having high resistance to dry etching, (5) being capable of being easily developed using a developer (e.g., 2.38 wt % of tetramethyl ammonium hydroxide (TMAH)) which is very common in semiconductor manufacturing.

However, a common polymer for a chemically amplified photoresist for ArF excimer laser, e.g., terpolymer containing methylmethacrylate, t-butylmethacrylate and methacrylate monomers, does not satisfy all the above. In particular, the polymer has very weak resistance to etching and weak adhesion to a layer. Also, when using a developer which has been widely used for most other photoresist films, a non-exposed portion is also developed due to a plurality of hydrophilic functional groups being connected to the polymer, e.g., carboxyl group, so the critical dimension of a pattern tends to change. Thus, the developing should be performed using extra developer having a low concentration. However, if the concentration of the developer is very low, deviation in the critical dimension of the pattern markedly increases because the critical dimension of the pattern is very sensitive to changes in the concentration of the developer.

Thus, recently, research has been conducted into a photosensitive polymer suitable for use with an ArF excimer laser, in which an alicyclic compound such as isobornyl, adamantyl and tricyclodecanyl groups is introduced to a backbone of the polymer to improve resistance to etching. However, these polymers have defects too. For example, resistance to dry etching is still unfavorable, and adhesion to a layer is poor, thus causing lifting and/or instability of photoresist patterns.

The present invention is directed to overcoming or at least reducing the effects of one or more of the problems set forth above.

SUMMARY OF THE INVENTION

In accordance with one aspect of the invention there is provided a photosensitive copolymer polymerized from 5-norbornene-2-methanol derivative monomer having a $C_1$ to $C_{20}$ aliphatic hydrocarbon as a side chain, and maleic anhydride monomer.

In accordance with another aspect of the present invention there is provided a dissolution inhibitor comprising: a material selected from the group consisting of a tricyclodecane derivative and a sarsasapogenin derivative, each having an acid-labile group as a functional group.

In accordance with another aspect of the present invention there is provided a chemically amplified photoresist composition comprising: a photosensitive polymer polymerized with three or more monomers which includes one or more monomers selected from the group consisting of norbornene alkyl ester, norbornene carboxylic acid and (meth)acrylic acid derivative, 5-norbornene-2-methanol derivative monomer having $C_1$ to $C_{20}$ aliphatic hydrocarbon as a side chain, and maleic anhydride monomer; and a photosensitive acid generator of a weight percent in the range from 1 through 15 based on the weight of the photosensitive polymer.

DETAILED DESCRIPTION OF SPECIFIC EMBODIMENTS

Korean application no. 98-21761 filed Jun. 24, 1998 discloses the same subject matter as the present application and is hereby incorporated by reference as if fully set forth herein.

A photosensitive polymer, a dissolution inhibitor and a chemically amplified photoresist composition containing the same, according to preferred embodiments of the present invention, will now be described more fully. Also, a preferred photolithography process using the chemically amplified photoresist composition will be described. This invention may, however, be embodied in many different forms and should not be construed as being limited to the embodiments set forth herein; rather, these embodiments are provided so that this disclosure will be thorough and complete, and will fully convey the concepts of the invention to those skilled in the art.

It is an object of the present invention to provide a photosensitive polymer which can be exposed using an ArF excimer laser, having a great resistance to dry etching and excellent adhesion to a layer.

It is another object of the present invention to provide a dissolution inhibitor for a chemically amplified photoresist, having a great resistance to dry etching and excellent adhesion to a layer.

It is still another object of the present invention to provide a chemically amplified photoresist composition containing the photosensitive polymer and/or the dissolution inhibitor.

To achieve the first object of the invention, there is provided a photosensitive copolymer polymerized from 5-norbornene-2-methanol derivative monomer having a $C_1$ to $C_{20}$ aliphatic hydrocarbon as a side chain, and maleic anhydride monomer. Preferably, the aliphatic hydrocarbon group is a $C_7$ to $C_{20}$ alicyclic hydrocarbon selected from the group consisting of adamantyl, norbornyl and isobornyl.

Also, there is provided a photosensitive polymer polymerized from three or more monomers comprising: one or more monomers selected from the group consisting of norbornene alkyl ester, norbornene carboxylic acid and (meth)acrylate derivative; 5-norbornene-2-methanol derivative monomer having a $C_1$ to $C_{20}$ aliphatic hydrocarbon as a side chain; and maleic anhydride monomer.

To achieve the second object of the present invention, there is provided a dissolution inhibitor comprising: a material selected from the group consisting of a tricyclodecane derivative and a sarsasapogenin derivative, each having an acid-labile group as a functional group. Preferably, the tricyclodecane derivative is bis(t-butoxycarbonyloxymethyl)tricyclodecane or bis (tetrahydropyranyloxymethyl) tricyclodecane, and the sarsasapogenin derivative is t-butoxycarbonyl sarsasapogenin or tetrahydropyranyl sarsasapogenin.

To achieve the third object of the present invention, there is provided a chemically amplified photoresist composition comprising: a photosensitive polymer polymerized with three or more monomers which includes one or more monomers selected from the group consisting of norbornene alkyl ester, norbornene carboxylic acid and (meth)acrylic acid derivative, 5-norbornene-2-methanol derivative monomer having $C_1$ to $C_{20}$ aliphatic hydrocarbon as a side chain, and maleic anhydride monomer; and a photosensitive acid generator of a weight percent in the range from 1 through 15 based on the weight of the photosensitive polymer.

Preferably, the aliphatic hydrocarbon is a $C_7$ to $C_{20}$ alicyclic hydrocarbon selected from the group consisting of adamantyl, norbornyl and isobornyl.

Preferably, the photosensitive acid generator is triarylsulfonium salts, diaryliodonium salts or sulfonates.

Preferably, the chemically amplified photoresist composition further comprises an organic base of a weight percent ranging from 0.01 through 2.0 based on the weight of the photosensitive polymer.

Preferably, the dissolution inhibitor is a material selected from the group consisting of a $C_1$ to $C_{40}$ hydrocarbon compound having an acid-labile dialkyl malonate as a functional group, a tricyclodecane derivative having an acid-labile group as a functional group, and a sarsasapogenine derivative having an acid-labile group as a functional group.

Preferably, the organic base is trimethylamine, triisobutylamine, triisooctylamine, diethanolamine or triethanolamine.

The photosensitive polymer according to the present invention preferably has a cyclic backbone and hydroxy group as a functional group. Thus, the chemically amplified photoresist composition containing the photosensitive polymer typically has a high resistance to etching and excellent adhesion to the underlying layer. In particular, when an aliphatic hydrocarbon side chain has a cyclic structure, resistance to etching generally increases.

Photosensitive Polymer

A photosensitive polymer according to a preferred embodiment of the present invention is a photosensitive copolymer polymerized with 5-norbornene-2-methanol derivative monomer having a $C_1$ to $C_{20}$ aliphatic hydrocarbon as a side chain and a maleic anhydride monomer.

Preferably, the aliphatic hydrocarbon is a $C_7$ to $C_{20}$ alicyclic hydrocarbon, e.g., adamantyl, norbornyl or isobornyl, which improves resistance to etching.

The photosensitive polymer can be for example, expressed by the following chemical formula (1).

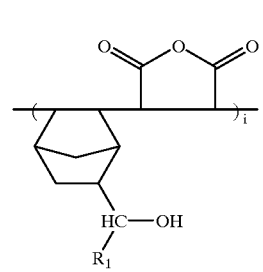

(1)

In the chemical formula (1), R1 is a $C_1$ to $C_{20}$ aliphatic hydrocarbon, i is an integer, and the weight average molecular weight of the polymer is 3,000–100,000.

A photosensitive polymer according to another embodiment of the present invention is preferably a terpolymer polymerized with one or more monomers selected from the group consisting of norbornene alkyl ester, norbornene carboxylic acid and (meth)acrylate derivative monomers, 5-norbornene-2-methanol derivative monomer having a $C_1$ to $C_{20}$ aliphatic hydrocarbon, and maleic anhydride monomer.

The photosensitive polymer is expressed by the following chemical formula (2).

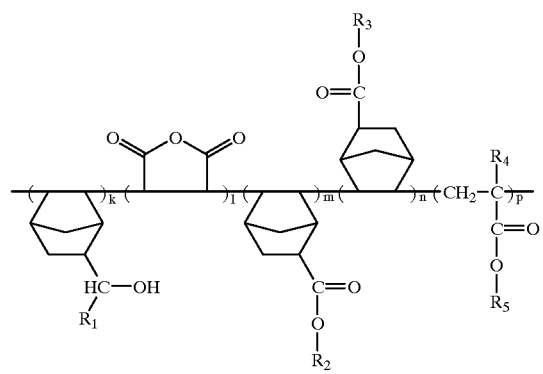

(2)

In the chemical formula (2), R1 is a $C_1$ to $C_{20}$ aliphatic hydrocarbon, R2 and R5 are each independently t-butyl or tetahydropyranyl, R3 is hydrogen atom, methyl, ethyl, n-butyl or 2-hydroxyethyl, and R4 is hydrogen atom or methyl. k, l, m, n, p are integers and the ratio of $k/(k+l+m+n+p)$ is advantageously 0.1–0.5, the ratio of $l/(k+l+m+n+p)$ is advantageously 0.1–0.5, the ratio of $m/(k+l+m+n+p)$ is advantageously 0.0–0.5, the ratio of $n/(k+l+m+n+p)$ is advantageously 0.0–0.3, and the ratio of $p/(k+l+m+n+p)$ is advantageously 0.0–0.4. The weight average molecular weight is preferably 3,000–100,000.

Preferably, R1 is a $C_7$ to $C_{20}$ alicyclic hydrocarbon. Here, R1 may be, for example, adamantyl, norbornyl or isobornyl.

The photosensitive polymer of the present invention preferably has a cyclic norbornane as a backbone, so it generally has strong resistance to etching. In particular, in the case where aliphatic hydrocarbon, preferably, alicyclic hydrocarbon, is coupled to norbornane as a side chain, resistance to etching further increases. Also, because a hydroxy group is coupled as a functional group, adhesion to the underlying layer is excellent, and a conventional developer, e.g. TMAH (2.38 wt %), can be used for example, for developing.

Dissolution Inhibitor

A dissolution inhibitor according to the present invention is preferably a compound in which an acid-labile dialkylmalonate group is combined as a functional group with a $C_1$ to $C_{40}$ hydrocarbon compound, such as a compound as shown in chemical formula (3).

(3)

In the chemical formula (3), R6 is cyclohexyl, dimethylcyclohexyl, xylenyl or naphthalenylmethyl, R2 is t-butyl, tetrahydropyranyl or trimethylsilyl, and j is 1 or 2.

The dissolution inhibitor generally has a very low solubility due to its bulky functional group, a dialkylmalonate group. However, after the exposure process, the dialkylmalonate group is hydrolyzed by acid to form a malonic acid group, markedly increasing solubility. Also, because the dialkylmalonate group is typically stable to heat the dialkylmalonate group shows stable thermal characteristics at temperatures higher than a glass transition temperature of the polymer. This means that the characteristics of the dissolution inhibitor constituting the photoresist are not converted into a semi-softened phase at a temperature above the glass transition temperature of the photoresist.

Another dissolution inhibitor according to the present invention may be, for example, a tricyclodecane derivative or a sarsasapogenin derivative having an acid-labile group as a functional group.

The tricyclodecane derivative can be is expressed, for example, by the following chemical formula (4), and the sarsasapogenin derivative can be expressed, for example, by the following chemical formula (5).

(4)

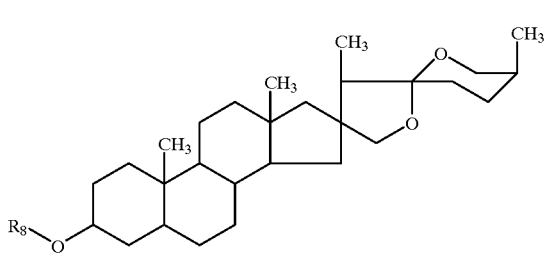
(5)

In the chemical formulae (4) and (5), R7 and R8 are each independently t-butoxycarbonyl or tetrahydropyranyl.

The above dissolution inhibitors generally have strong resistance to etching due to their cyclic structure. Also, because of the bulky alkoxy functional group, the dissolution inhibitors show very low solubility. However, after the exposure process, the alkoxy group is hydrolyzed by acid to form a hydroxy group, markedly increasing solubility.

Chemically Amplified Photoresist Composition

A chemically amplified photoresist composition according to the present invention includes a photosensitive polymer, such as the ones described above, and a photosensitive acid generator.

Preferably, the photosensitive acid generator is mixed at a ratio from 1 to 15 weight percent based on the total weight of the photosensitive polymer. Such a material may include, for example, triarylsulfonium salts, diaryliodonium salts or sulfonates. In detail, the photosensitive acid generator may be formed, for example, of the following materials: triphenylsulfonium triflate, triphenylsulfonium antimonate, diphenyliodonium triflate, diphenylidonium antimonate, methoxydiphenyliodonium triflate, di-t-butyldiphenyliodonium triflate, 2,6,-dinitrobenzylsulfonate, pyrogallol tris(alkylsulfonate) or N-hydroxysuccinimide triflate.

Preferably, the photoresist composition according to the present invention further includes a dissolution inhibitor of 1 to 50 weight percent based on the total weight of the photosensitive polymer. The dissolution inhibitor can be selected from the above-described dissolution inhibitors. By adding the dissolution inhibitor, the difference in the photoresist between before and after exposure increases; that is, the contrast, markedly increases.

Preferably, the photoresist composition according to the present invention further includes an organic base of 0.01 to 2.0 weight percent based on the total weight of the photosensitive polymer. The organic base may be, for example, triethylamine, triisobutylamine, triisooctylamine, diethanolamine or triethanolamine. The organic base typically prevents the acid generated in an exposed portion from diffusing into a non-exposed portion after exposure, and deforming a pattern by acidolizing the photoresist composition in the non-exposed portion.

As described above, the photoresist composition of the present invention preferably includes a photosensitive polymer having a cyclic norbornane as a backbone, aliphatic hydrocarbon, preferably, alicyclic hydrocarbon, as a side chain, and hydroxy group as a functional group. Thus, the photoresist composition typically has excellent adhesion to the underlying layer as well as strong resistance to etching. Also, a conventional developer, e.g., TMAH (2.38 weight percent), can be used for developing. Also, the photosensitive polymer is generally bulky before the exposure. However, a bulky side chain group such as a maleic anhydride or ester group is combined with the backbone of the polymer and is acidolyzed into carboxyl group. As a result, polarity (solubility) of the exposed photoresist film is markedly different from that of the non-exposed photoresist film.

Also, in the case where the photoresist composition includes a cyclic dissolution inhibitor having a bulky alkoxy group, resistance to etching markedly increases in the photoresist composition. In addition, inter alia, because the dissolution inhibitor of the present invention can have an acid-labile alkoxy or di-alkyl malonic acid group which forms hydroxy or malonic acid group through acidolysis, the difference in the photoresist between before and after exposure, that is the contrast, markedly increases.

Below is described exemplary methods for preparation of components of the present invention. Other methods would be useful as well as known to those of skill in the art.

Preparation Method of Photosensitive Polymer

1. Preparation of Monomer 1-1. Preparation of 5-norbornene-2-aliphatic Hydrocarbon Methanol (III) Monomer As shown in the following reaction formula (1), 5-norbornene-2-aldehyde (I) is reacted in aliphatic hydrocarbon magnesium bromide (II) solution to prepare 5-norbornene-2-aliphatic hydrocarbon methanol (III) through a substitution reaction.

(1)

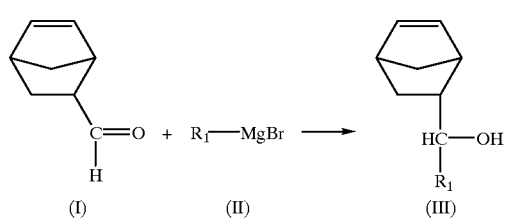

In the reaction formula (1), R1 is a $C_1$ to $C_{20}$ aliphatic hydrocarbon.

1-2. Preparation of Norbornene Alkylester (VI or VII) Monomer

As shown in the following reaction formula (2), after dissolving cyclopentadiene (IV) in an organic solvent, alkylacrylate (V) is added to prepare norbornene alkylester (VI or VII).

(2)

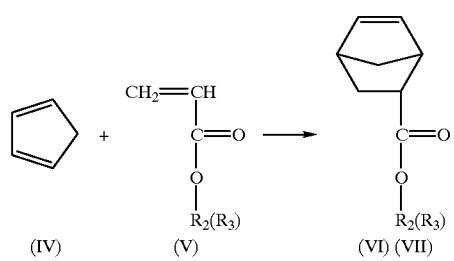

In the reaction formula (2), R2 is t-butyl or tetrahydropyranyl, and R3 is hydrogen, methyl, ethyl, n-butyl or 2-hydroxyethyl.

2. Preparation of Polymer (X)

2-1. Preparation of Polymer (X) Expressed by the Chemical Formula (2)

A polymer (X) is polymerized from one or more monomers selected from the group consisting of norbornene alkylesters (VI and VII) and (meth)acrylate derivative (IX), norbornene aliphatic hydrocarbon alcohol (III) and maleic anhydride (VIII) through the reaction expressed by the following reaction formula (3).

(3)

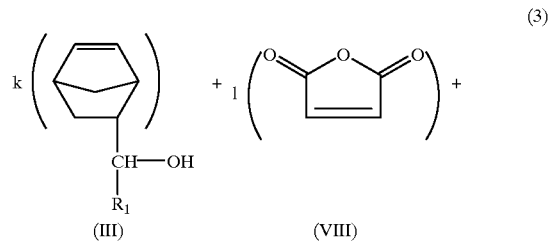

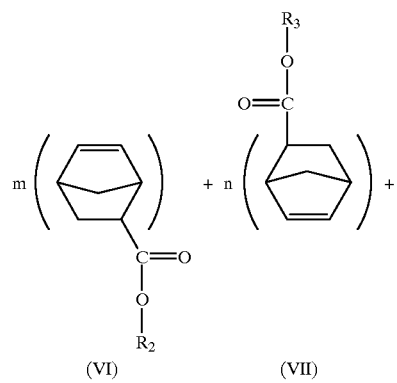

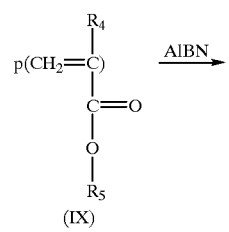

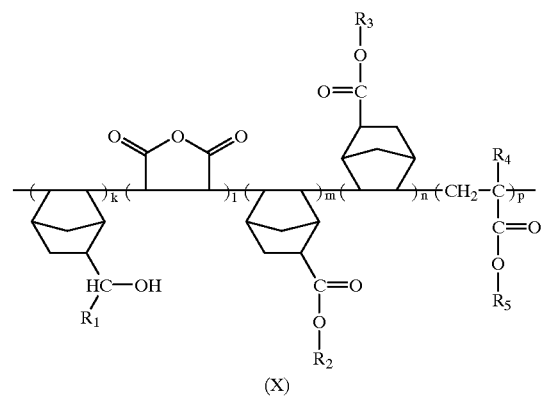

In the reaction formula (3), R1 is a $C_1$ to $C_{20}$ aliphatic hydrocarbon, R2 and R5 are each independently t-butyl or tetrahydropyranyl, R3 is hydrogen atom, methyl, ethyl, n-butyl or 2-hydroxyethyl, and R4 is hydrogen atom or methyl. Also, k, l, m, n and p are integers, the ratio of k/(k+l+m+n+p) is 0.1–0.5, the ratio of l/(k+l+m+n+p) is 0.1–0.5, the ratio of m/(k+l+m+n+p) is 0.1–0.5, the ratio of n/(k+l+m+n+p) is 0.0–0.3, and the ratio of p/(k+l+m+n+p) is 0.0–0.4. The weight average molecular weight of the polymer ranges from 3,000 to 100,000.

After dissolving one or more monomers selected from the group consisting of norbornene alkylesters (VI and VII) and (meth)acrylate derivative (IX), norbornene aliphatic hydrocarbon alcohol (III) and maleic anhydride (VIII) in an organic solvent, e.g., toluene, a polymerization initiator, e.g., azobisisobutyronitrile (AIBN), is added, and the polymer (X) is obtained through polymerization.

2-2. Preparation of Polymer Expressed by the Chemical Formula (1)

Here, the polymer is polymerized from norbornene aliphatic hydrocarbon alcohol monomer and maleic anhydride monomer through the same polymerization as in the reaction formula (3), except that m, n and p are 0 and k and l have the same values as each other. The obtained copolymer has a weight average molecular weight ranging from 3,000 to 100,000.

Preparation Method of Dissolution Inhibitor

1. Preparation method of tricyclodecane derivative of the chemical formula (3)

Here, the tricyclodecane derivative has an acid-labile functional group.

Di-t-butyl dicarbonate or 3,4-dihydro-2-pyran and 4,8-bis (hydroxymethyl)tricyclodecane are reacted in an organic solvent, e.g. tetrahydrofuran (THF), and the dissolution inhibitor expressed by the chemical formula (3) is obtained through a reaction for a predetermined time according to methods known in the art.

2. Preparation method of sarsasapogenin derivative of the chemical formula (4)

Here, the sarsasapogenin derivative has an acid-labile functional group.

Di-t-butyl dicarbonate or 3,4-dihydro-2-pyran and sarsasapogenin are reacted in an organic solvent, e.g. THF, and the dissolution inhibitor expressed by the chemical formula (4) is obtained through a reaction for a predetermined time according to methods known in the art.

3. Preparation of compound expressed by the chemical formula (5)

Here, in the compound, an acid-labile di-alkylmalonate group as a functional group is combined with $C_1$ to $C_{40}$ hydrocarbon compound.

After dissolving di-alkylmalonate in an organic solvent, e.g. a THF solution containing sodium hydroxide, a halogen compound is added to the solution to prepare alkylmalonyl-hydrocarbon compound expressed by the chemical formula (5) through a substitution reaction as well known in the art.

Preparation Method of Chemically Amplified
Photoresist Composition, and Photolithography
Using the Same A chemically amplified photoresist composition according to the present invention is prepared by dissolving and mixing the photosensitive polymer expressed by the chemical formula (2), prepared by the above-described method, and a photosensitive acid generator in an appropriate solution.

Here, the photosensitive acid generator is mixed at a weight percent in the range from 1 to 15 based on the total weight of the polymer. Preferably, the photosensitive acid generator is triarylsulfonium salts, diaryliodonium salts or sulfonates, which are thermally stable.

Also, preferably, an organic base at a weight percent in the range from 0.01 to 2.0 based on the weight of the polymer or polymer mixture is further dissolved to form the photoresist composition. Preferably, the organic base is triethylamine, triisobutylamine, triisooctylamine, diethanolamine or triethanolamine.

The chemically amplified photoresist composition formed by the above method may be applied to a general photolithography process by any known means. Particularly, the chemically amplified photoresist composition is suitable for forming a fine pattern having a design rule of 0.25 $\mu$m or less, using an ArF excimer laser light source for exposure.

First, the above-described photoresist composition is deposited on a substrate having a target to be patterned, to form a photoresist film having a predetermined thickness. Then, the photoresist film is pre-baked before exposure. After the pre-baking, the photoresist film is exposed to an ArF excimer laser light source for exposure, using a mask having a predetermined pattern. Acid is generated in the photosensitive acid generator of the photoresist film by the exposure, and the photosensitive polymer is hydrolyzed into a polymer having excessive carboxyl group by catalytic reaction with the generated acid as shown in the following reaction formula (4). Then, as shown in the reaction formula (5), (6) or (7), the dissolution inhibitor is hydrolyzed by acid, forming hydroxy group.

As a result, the polarity of the exposed portion of the photoresist film and the polarity of the non-exposed portion become very different. That is, contrast is high.

After the exposure, a thermal treatment is performed on the photoresist film for a short time before development. The post-exposure thermal treatment further activates acidolysis by a catalytic reaction of acid within the exposed portion. In other words, this completely hydrolyzes ester group or acid anhydride of the photosensitive polymer within the exposed portion into carboxyl group, and alkoxy group of the dissolution inhibitor into hydroxy group, to remarkably increase the contrast.

Next, a developing process is performed using an appropriate developer, thereby completing a photoresist pattern. Here, the developer has a concentration suitable for a general photo process, e.g. TMAH of 2.38 weight percent.

After forming the photoresist pattern, a film to be patterned is etched to form an intended pattern. The photoresist pattern of the present invention is formed of a photoresist film containing a photosensitive polymer having a cyclic backbone and an aliphatic hydrocarbon side chain, preferably, an alicyclic hydrocarbon side chain, so the photoresist pattern has a strong resistance to etching. Thus, a pattern having excellent profile pattern with a precise critical dimension can be formed.

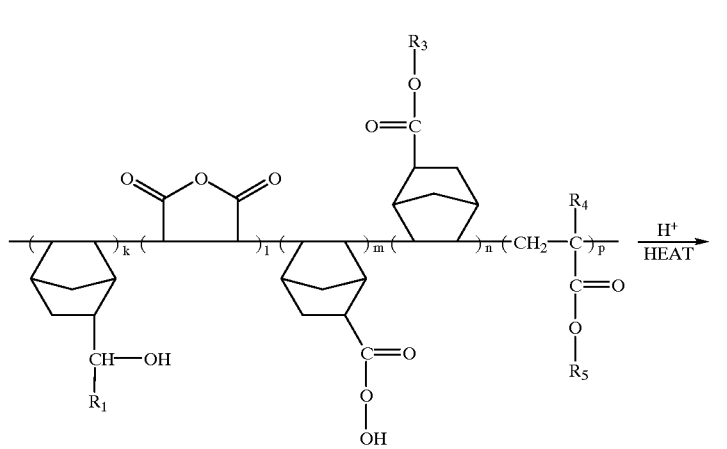
(4)
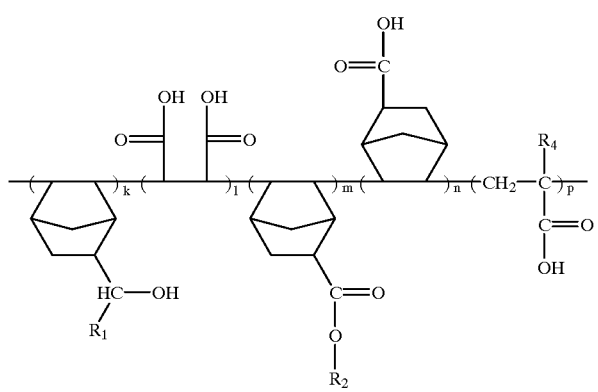
(5)
(6)
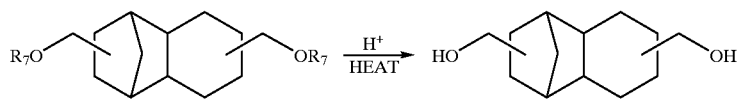
(7)
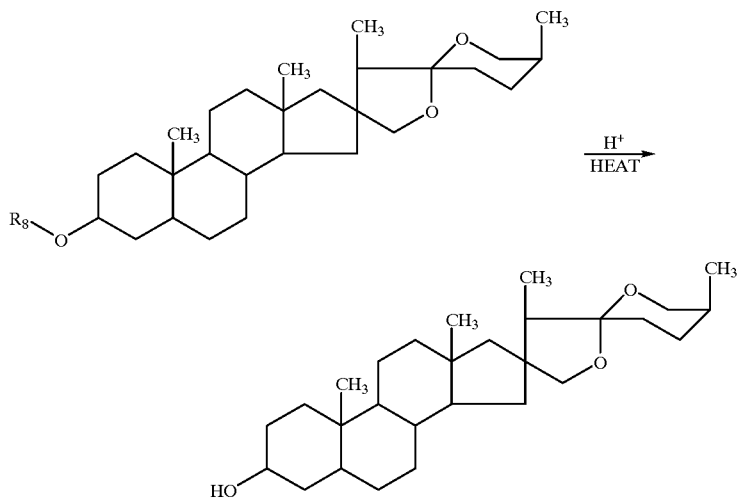
The present invention will be described through the following examples. However, the present invention is not limited to the following examples.
EXAMPLE 1
Preparation of Monomer
1-1. Preparation of 5-norbornene-2-cyclohexylmethanol 150 ml of a cyclohexylmagnesium bromide (0.1 mol, dissolved in diethyl ether) solution was put in a round-bottom flask, and 14 g of 5-norbornene-2-aldehyde (0.11 mol) was slowly added to the solution, and refluxed for approximately 12 hours.

After reaction, the reaction product was dissolved in excessive water, neutralized using hydrochloric acid (HCl), and then extracted using diethylether.

The resulting solution was dried using magnesium sulfate, and the crude product was separated by vacuum distillation (yield 60%)

1-2. Preparation of 5-norbornene-2-norbornylmethanol 200 ml of 2-norbornylmagnesium bromide (0.1 mol, dissolved in THF) solution was put in a round-bottom flask, 14 g of 5-norbornene-2-aldehyde (0.11 mol) was slowly added to the solution, and then reacted at 45° C. for approximately 20 hours.

After reaction, excessive THF was evaporated using a rotary evaporator. The reaction product was dissolved in excessive water, and then neutralized using HCl. Then, after extraction using diethylether, the resulting solution was dried using magnesium sulfate. Lastly, the crude product was separated by vacuum distillation (yield 45%).

1-3. Preparation of 5-norbornene-2-adamantylmethanol

A reaction product was separated by the same method as in (1-2) of Example 1, except that 200 ml of 2-adamantylmagnesium bromide (0.1 mol) solution was used instead of 2-norbornylmagnesium bromide (yield 40%)

1-4. Preparation of t-butyl-5-norbornenecarboxylic Acid 6.6 g of cyclopentadiene (0.1 mol) obtained through distillation from dicyclopentadiene was put in a round-bottom flask, and dissolved in 100 ml of methylene chloride. Then, 14 g of t-butylacrylic acid (0.11 mol) was slowly added at 0° C., and reacted at room temperature for approximately 20 hours.

After reaction, the reaction product was separated by vacuum distillation (yield 70%).

1-5. Preparation of 2-hydroxyethyl-5-norbornenecarboxylic Acid 6.6 g of cyclopentadiene (0.1 mol) obtained through simple distillation from dicyclopentadiene was put in a round-bottom flask, and dissolved in 150 ml of THF anhydride. Then, 12.8 g of 2-hydroxyethylacrylic acid (0.11 mol) was slowly added at 0° C., and reacted at room temperature for approximately 20 hours.

After reaction, the reaction product was separated by vacuum distillation (yield 65%).

EXAMPLE 2

Preparation of Copolymer

Preparation of poly(norbornene norbornylmethanol-maleic anhydride)

21 g of 5-norbornene-2-norbornylmethanol and 10 g of maleic anhydride were dissolved in 120 ml of THF anhydride. Then, 0.65 g of AIBN was added to the solution, purged under a nitrogen atmosphere for 2 hours, and then polymerized under reflux conditions at 70° C. for approximately 24 hours.

After polymerization, the reaction product was precipitated in excessive n-hexane (approximately 10 times), dissolved again in THF, and then reprecipitated in n-hexane. After filtering the precipitant using a glass filter, the resultant was dried in a vacuum oven at 50° C. for approximately 24 hours, thereby separating 13 g of reaction product.

The obtained reaction product was a copolymer polymerized from 5-norbornene-2-norbornylmethanol and maleic anhydride, having a weight average molecular weight of 5,570 and a polydispersity of 1.95.

EXAMPLE 3

Preparation of Terpolymer 3-1. Preparation of Poly(norbornene Norbornylmethanol-maleic Anhydride-t-butylmethacrylic acid)

21 g of 5-norbornene-2-norbornylmethanol, 10 g of maleic anhydride and 14 g of t-butylmethacrylic acid were dissolved in 200 ml of THF anhydride. Then, 29.3 g of reaction product was obtained through the same process as in Example 2, except that 0.98 g of AIBN was added.

The obtained reaction product had a weight average molecular weight of 5,537 and a polydispersity of 2.1.

3.2. Preparation of Poly(norbornene norbornylmethanol-maleic anhydride-t-butyl-5-norbornene ester)

10.5 g of 5-norbornene-2-norbornylmethanol, 10 g of maleic anhydride and 9.7 g of t-butyl-5-norbornene ester were dissolved in 120 ml of THF anhydride. Then, 13.6 g of reaction product was obtained through the same process as in (3-1) of Example 3, except that 0.65 g of AIBN was added.

The obtained reaction product had a weight average molecular weight of 5,674 and a polydispersity of 2.2.

EXAMPLE 4

Preparation of Tetrapolymer 4.1. Preparation of Poly(norbornene norbornylmethanol-maleic anhydride-t-butyl-5-norbornene ester-5-norbornene carboxylic acid)

8.4 g of 5-norbornene-2-norbornylmethanol, 10 g of maleic anhydride, 9.7 g of t-butyl-5-norbornene ester and 1.4 g of 5-norbornene carboxylic acid were dissolved in 150 ml of THF anhydride. Then, 14.7 g of reaction product was obtained through the same process as in (3-1) of Example 3, except that 0.66 g of AIBN was added.

The obtained reaction product had a weight average molecular weight of 5,780 and a polydispersity of 2.2.

4.2. Preparation of Poly(norbornene norbornylmethanol-maleic anhydride-t-butyl-5-norbornene ester-hydroxyethylnorbornene ester)

6.3 g of 5-norbornene-2-norbornylmethanol, 10 g of maleic anhydride, 9.7 g of t-butyl-5-norbornene ester and 3.6 g of 2-hydroxyethyl-5-norbornene ester were dissolved in 150 ml of THF anhydride. Then, 13.3 g of reaction product was separated through the same process as in (4-1) of Example 4.

The obtained reaction product had a weight average molecular weight of 5,680 and a polydispersity of 2.1.

EXAMPLE 5

Preparation of Dissolution Inhibitor 5.1. Preparation of Bis(t-butoxycarbonyloxymethyl) tricyclodecane 20 g of 4,8-bis(hydroxymethyl)tricyclodecane 0.1 mol) and 22 g of triethylamine (0.22 mol) were put in a round-bottom flask, and dissolved in 400 ml of THF. 65 g of di-t-butyldicarbonate (0.3 mol) was added to the solution, and reacted at approximately 60° C.

After reaction, excessive THF was evaporated, the reaction product was poured into excessive water, and then the reaction product was neutralized using HCl. Lastly, after extraction using diethyl ether, the reaction product was separated using column chromatography (yield 65%).

5.2. Preparation of Bis(tetrahydropyranyloxymethyl) tricyclodecane 20 g of 4,8-bis(hydroxymethyl)tricyclodecane (0.1 mol) and 25 g of 3,4-dihydro-2-pyran (0.3 mol) were put in a round-bottom flask, and dissolved in 350 ml of THF. Then, a small amount of p-toluene sulfonic acid (p-TSA), enough to act as a catalyst, was added, and reacted at 45° C. for approximately 12 hours.

The reaction product was obtained by the same process as in (5-1) of Example 5 (yield 55%).

5-3. Preparation of Tetrahydropyranyl Sarsasapogenin 41.6 g of sarsasapogenin (0.1 mol) and 8.6 g of 3,4-dihydro-2-pyran (0.11 mol) were put in a round-bottom flask, and dissolved in 300 ml of THF. Then, a small amount of p-TSA was added to the solution, and reacted at 45° C. for approximately 12 hours.

After reaction, the reaction product was dissolved in excessive water, and neutralized using HCl, and extracted using diethyl ether. The precipitant was recrystallized to separate the reaction product (yield 75%).

5-4. Preparation of 1,4-bis(di-t-butylmalonyl)cyclohexane

Sodium hydride (0.12 mol) was put in a round-bottom flask, and dissolved in 250 ml of THF. Then, di-t-butylmalonate (0.11 mol) was slowly added to the solution and reacted for approximately 1 hour. 1,4-dibromocyclohexane (0.05 mol) was slowly dropped into the reaction product at 0° C., and reacted at 45° C. for approximately 12 hours.

After reaction, excessive THF was evaporated from the reaction product, and the reaction product was dissolved again in excessive water, neutralized using HCl and extracted using diethylether.

The resulting solution was dried using magnesium sulfuric acid, and the crude product was separated using column chromatography (yield 55%).

5-5. Preparation of 1,4-bis(di-t-butylmalonyl)-p-xylene

The same processes as in (5-4) of Example 5 were performed under the same conditions, except that dibromo-p-xylene (0.5 mol) was used instead of 1,4-dibromocyclohexane.

The resulting solution was dried using magnesium sulfuric acid, and the crude product was separated using column chromatography (yield 55%).

EXAMPLE 6

Preparation of Photoresist Composition, and Photolithography Using the Same 6-1. Preparation of Photoresist Composition Using a Terpolymer, and Photolithography Using the Same Here, the terpolymer which was used was poly (norbornene norbornylmethanol-maleic anhydride-t-butylmethacrylate).

1.0 g of the terpolymer prepared in (3-1) of Example 3, polymerized from norbornene-norbornylmethanol, maleic anhydride and t-butyl methacrylate at a ratio of 0.3:0.4:0.3, was dissolved in 6 g of propylene glycol monomethyl ether acetate, and 0.02 g of triphenylsulfonium triflate (TPSOTf) as a photosensitive acid generator was added to the solution, and vigorously stirred. Then, the mixture was filtered through a filter having 0.2 μm pores, resulting in a photoresist composition.

The obtained photoresist composition was spin-coated on a wafer having a material film to be patterned, to a thickness of approximately 0.5 μm. The wafer coated with the photoresist composition was soft baked at approximately 130° C. for approximately 90 seconds, and exposed using a mask defining a pattern having 0.30 μm line and space arrays and an ArF excimer laser light source. Then, the resultant was soft baked at approximately 140° C. for approximately 90 seconds, and developed using 2.38 weight percent of TMAH for approximately 60 seconds, thereby forming a photoresist pattern.

As a result, a photoresist pattern having an excellent profile with 0.30 μm line and space arrays could be formed with an exposure energy of 15 mJ/cm² dose.

6-2. Preparation of a photoresist composition using a terpolymer and a Dissolution Inhibitor, and Photolithography Using the Same Here, the terpolymer which was used was poly (norbornene norbornylmethanol-maleic anhydride-t-butylmethacrylate).

A photoresist composition was prepared and photolithography was performed by the same method as in (6-1) of Example 6, except that 0.05 g of tetrahydropyranyl sarsasapogenin prepared by (5-3) of Example 5 was used as the dissolution inhibitor and soft-baking was performed at 120° C.

As a result, a photoresist pattern having an excellent profile with 0.30 μm line and space arrays could be formed with an exposure energy of 20 mJ/cm² dose. Also, a material layer pattern having an excellent profile could be obtained using the photoresist pattern.

6-3. Preparation of a Photoresist Composition Using a Terpolymer, and Photolithography Using the Same Here, the used terpolymer was poly(norbornene norbornylmethanol-maleic anhydride-t-butyl-5-norbornene ester).

A photoresist composition was prepared and photolithography was performed by the same method as in (6-1) of Example 6, except that the terpolymer prepared by (3-2) of Example 3, polymerized from norbornene-norbornylmethanol, maleic anhydride, and t-butyl-5-norbornene ester monomers at a ratio of 0.5:1.0:0.5, was used instead of 1.0 g of the terpolymer polymerized from norbornene-norbornylmethanol, maleic anhydride, t-butylmethacrylic acid monomers at a ratio of 0.3:0.4:0.3.

As a result, a photoresist pattern having an excellent profile with 0.30 μm line and space arrays could be formed with an exposure energy of 18 mJ/cm₂ dose. Also, a material layer pattern having an excellent profile could be obtained using the photoresist pattern.

6-4. Preparation of a Photoresist Composition Using a Terpolymer and a Dissolution Inhibitor, and Photolithography Using the Same.

Here, the terpolymer which was used was poly (norbornene norbornylmethanol-maleic anhydride-t-butyl-5-norbornene ester).

A photoresist composition was prepared and photolithography was performed by the same method as in (6-1) of Example 6, except that 0.1 g of bis(t-butoxycarbonyloxymethyl)tricyclodecane prepared by (5-1) of Example 5 was further added as the dissolution inhibitor, and soft-baking was performed at 110° C.

As a result, a photoresist pattern having an excellent profile with 0.30 μm line and space arrays could be formed with an exposure energy of 23 mJ/cm² dose. Also, a material layer pattern having an excellent profile could be obtained using the photoresist pattern.

6-5. Preparation of a Photoresist Composition Using a terpolymer and a Dissolution Inhibitor, and Photolithography Using the Same Here, the terpolymer which was used was poly (norbornene norbornylmethanol-maleic anhydride-t-butyl-5-norbornene ester).

A photoresist composition was prepared and photolithography was performed by the same method as in (6-4) of Example 6, except that 0.1 g of bis(tetrahydropyranyloxymethyl)tricyclodecane prepared by (5-1) of Example 5 was added as the dissolution inhibitor instead of bis(t-butoxycarbonyloxymethyl)tricyclodecane.

As a result, a photoresist pattern having an excellent profile with 0.30 µm line and space arrays could be formed with an exposure energy of 21 mJ/cm$^2$ dose. Also, a material layer pattern having an excellent profile could be obtained using the photoresist pattern.

6-6. Preparation of a Photoresist Composition Using a Tetrapolymer, and Photolithography Using the Same.

Here, the tetrapolymer which was used was poly(norbornene norbornylmethanol-maleic anhydride-t-butyl-5-norbornene ester-5-norbornene carboxylic acid).

A photoresist composition was prepared and photolithography was performed by the same method as in (6-1) of Example 6, except that 1.0 g of the tetrapolymer prepared by (4-1) of Example 4, polymerized from norbornene-norbornylmethanol, maleic anhydride, t-butylmethacrylic acid and norbornene carboxylic acid monomers at a ratio of 0.4:1.0:0.5:0.1, was used as a photosensitive polymer, and pre-baking was performed at 110° C.

As a result, a photoresist pattern having an excellent profile with 0.30 µm line and space arrays could be formed with an exposure energy of 21 mJ/cm$^2$ dose. Also, a material layer pattern having an excellent profile could be obtained using the photoresist pattern.

6-7. Preparation of a Photoresist Composition Using a Tetrapolymer and a Dissolution Inhibitor, and Photolithography Using the Same Here, the tetrapolymer which was used was poly(norbornene norbornylmethanol-maleic anhydride-t-butyl-5-norbornene ester-2-hydroxyethyl-5-norbornene ester).

A photoresist composition was prepared and photolithography was performed by the same method as in (6-6) of Example 6, except that 1.0 g of the tetrapolymer prepared in (4-2) of Example 4, polymerized from norbornene-norbornylmethanol, maleic anhydride, t-butyl-5-norbornene ester and 2-hydroxyethyl-5-norbornene ester monomers at a ratio of 0.3:1.0:0.5:0.2, was used as a photosensitive polymer, and 0.1 g of bis(t-butoxylcarbonyloxymethyl)tricyclodecane prepared in (5-1) of Example 5 was further added as the dissolution inhibitor.

As a result, a photoresist pattern having an excellent profile with 0.30 µm line and space arrays could be formed with an exposure energy of 23 mJ /cm$^2$ dose. Also, a material layer pattern having an excellent profile could be obtained using the photoresist pattern.

6-8. Preparation of a Photoresist Composition Using a Tetrapolymer, a Dissolution Inhibitor and an Organic Base, and Photolithography Using the Same Here, the terpolymer which was used was poly(norbornene norbornylmethanol-maleic anhydride-t-butyl-5-norbornene ester-2-hydroxyethyl-5-norbornene ester).

A photoresist composition was prepared and photolithography was performed by the same method as in (6-7) of Example 6, except that 4 mg of triisobutylamine was further added as the organic base.

As a result, a photoresist pattern having an excellent profile with 0.30 µm line and space arrays could be formed with an exposure energy of 34 mJ/cm$^2$ dose. Also, a material layer pattern having an excellent profile could be obtained using the photoresist pattern.

The photosensitive polymer according to the present invention has a cyclic norbornane as a backbone, so its resistance to etching is strong. In particular, in the case where an aliphatic hydrocarbon group, preferably, an alicyclic hydrocarbon group, is coupled as a side chain, resistance to etching further increases. Because a hydroxy group is coupled as a functional group, adhesion to the underlying layer is excellent. Also, a conventional developer, e.g. TMAH (2.38 wt %), can be used.

Also, since the dissolution inhibitor according to the present invention has a cyclic structure, resistance to etching is strong. Also, the dissolution inhibitor has a very low solubility before exposure due to its functional group, which is a bulky alkoxy group. However, after exposure, the alkoxy group is hydrolyzed by acid to form a hydroxy group, so solubility markedly increases.

Thus, when preparing a photoresist composition using the photosensitive polymer and the dissolution inhibitor according to the present invention, etching resistance of the photoresist composition increases and adhesion to the underlying quality is improved. A conventional developer, e.g. TMAH (2.38 wt %), can be used for developing. Also, the polarity of the exposed photoresist film is very different from the non-exposed photoresist, thereby increasing contrast.

We claim:

1. A photosensitive copolymer polymerized from at least one 5-norbornene-2-methanol derivative monomer having a $C_1$ to $C_{20}$ aliphatic hydrocarbon as a side chain, and at least one maleic anhydride monomer.

2. A photosensitive copolymer of claim 1, wherein the photosensitive copolymer is expressed by the following chemical formula (1):

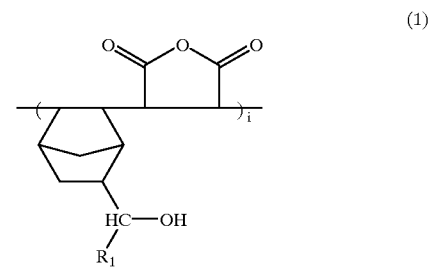

wherein R1 is a $C_1$ to $C_{20}$ aliphatic hydrocarbon; i is an integer; and the weight average molecular weight of the copolymer ranges from 3,000 to 100,000.

3. A photosensitive copolymer of claim 1, wherein the aliphatic hydrocarbon group is a $C_7$ to $C_{20}$ alicyclic hydrocarbon selected from the group consisting of adamantyl, norbornyl and isobornyl.

4. A photosensitive polymer polymerized from three or more monomers comprising:

one or more monomers selected from the group consisting of a norbornene alkyl ester, a norbornene carboxylic acid and a (meth)acrylate derivative;

at least one 5-norbornene-2-methanol derivative monomer having a $C_1$ to $C_{20}$ aliphatic hydrocarbon as a side chain; and maleic anhydride monomer.

5. A photosensitive polymer of claim 4, wherein the photosensitive polymer is expressed by the following chemical formula (2):

(2)

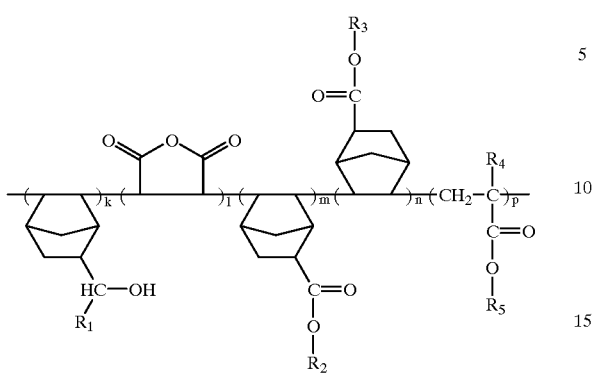

wherein R1 is a $C_1$ to $C_{20}$ aliphatic hydrocarbon; R2 and R5 can be the same or different and are each independently t-butyl or tetrahydropyranyl; R3 is hydrogen atom, methyl, ethyl, n-butyl or 2-hydroxyethyl; R4 is hydrogen atom or methyl; k, l, m, n and p may be the same or different and are integers, the ratio of $k/(k+l+m+n+p)$ is 0.1–0.5, the ratio of $l/(k+l+m+n+p)$ is 0.0–0.5, the ratio of $m/(k+l+m+n+p)$ is 0.0–0.5, $n/(k+l+m+n+p)$ is 0.0–0.3, the ratio of $p/(k+l+m+n+p)$ is 0.0–0.4; and the weight average molecular weight is 3,000–100,000.

6. A photosensitive polymer of claim 5, wherein R1 is a $C_7$ to $C_{20}$ alicyclic hydrocarbon.

7. A photosensitive polymer of claim 6, wherein the alicyclic hydrocarbon is adamantyl, norbornyl or isobornyl.

8. A dissolution inhibitor comprising;
   a material selected from the group consisting of a tricyclodecane derivative and a sarsasapogenin derivative, each having an acid-labile group as a functional group,
   wherein the tricyclodecane derivative is bis(t-butoxycarbonyloxymethyl) tricyclodecane or bis(tetrahydropyranyloxymethyl) tricyclodecane.

9. A dissolution inhibitor of claim 8,
   wherein the sarsasapogenin derivative is t-butoxycarbonyl sarsasapogenin or tetrahydropyranyl sarsasapogenin.

10. A chemically amplified photoresist composition comprising:
    a photosensitive polymer polymerized with three or more monomers which includes (i) one or more monomers selected from the group consisting of norbornene alkyl ester, norbornene carboxylic acid and (meth)acrylic acid derivative, (ii) 5-norbornene-2-methanol derivative monomer having $C_1$ to $C_{20}$ aliphatic hydrocarbon as a side chain, and (iii) maleic anhydride monomer; and
    a photosensitive acid generator of a weight percent in the range from 1 through 15 based on the weight of the photosensitive polymer.

11. A chemically amplified photoresist composition of claim 10, wherein the aliphatic hydrocarbon is an alicyclic hydrocarbon selected from the group consisting of adamantyl, norbornyl and isobornyl.

12. A chemically amplified photoresist composition of claim 10, wherein the polymer polymerized with three or more monomers is expressed by the following chemical formula (2),
    wherein R1 is a $C_1$ to $C_{20}$ aliphatic hydrocarbon; R1 and R5 are the same or different and are each independently t-butyl or tetrahydropyranyl; R3 is hydrogen atom, methyl, ethyl, n-butyl or 2-hydroxyethyl; R4 is hydrogen atom or methyl, k, l, m, n and p are integers, the ratio of $k/(k+l+m+n+p)$ is 0.1–0.5, the ratio of $l/(k+l+m+n+p)$ is 0.1–0.5, the ratio of $m/(k+l+m+n+p)$ is 0.0–0.5, the ratio of $n/(k+l+m+n+p)$ is 0.0–0.3, the ratio of $p/(k+l+m+n+p)$ is 0.0–0.4; and the weight average molecular weight is 3,000–100,000:

(2)

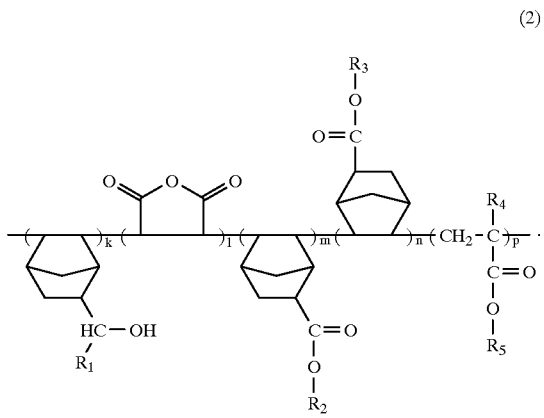

13. A chemically amplified photoresist composition of claim 12, wherein R1 is a $C_7$ to $C_{20}$ alicyclic hydrocarbon.

14. A chemically amplified photoresist composition of claim 10, wherein the photosensitive acid generator is triarylsulfonium salts, diaryliodonium salts or sulfonates.

15. A chemically amplified photoresist composition of claim 10, further comprising a dissolution inhibitor of a weight percent ranging from 1 through 50 based on the weight of the photosensitive polymer.

16. A chemically amplified photoresist composition of claim 15, wherein the dissolution inhibitor is a material selected from the group consisting of a $C_1$ to $C_{40}$ hydrocarbon compound having an acid-labile dialkyl malonate as a functional group, a tricyclodecane derivative having an acid-labile group as a functional group, and a sarsasapogenine derivative having an acid-labile group as a functional group.

17. A chemically amplified photoresist composition of claim 16, wherein the $C_1$ to $C_{40}$ hydrocarbon compound having an acid-labile dialkyl malonate as a functional group is expressed by the following chemical formula (3):

$$[R_6\text{--}[CH(CO_2R_2)_2]_j \qquad (3)$$

wherein j is 1 or 2; R6 is a $C_1$ to $C_{40}$ hydrocarbon compound; and R2 is t-butyl, tetrahydropyranyl and trimethylsilyl.

18. A chemically amplified photoresist composition of claim 17, wherein R6 is cyclohexyl, dimethylcyclohexyl, xylenyl or naphthalenylmethyl.

19. A chemically amplified photoresist composition of claim 16, wherein the tricyclodecane derivative is bis(t-butoxycarbonyloxymethyl)tricyclodecane or bis(tetrahydropyranyloxymethyl) tricyclodecane, and wherein the sarsasapogenin derivative is t-butoxycarbonyl sarsasapogenin or tetrahydropyranyl sarsasapogenin.

20. A chemically amplified photoresist composition of claim 10, further comprising an organic base of a weight percent ranging from 0.01 through 2.0 based on the weight of the photosensitive polymer.

* * * * *